(12) United States Patent
Shao et al.

(10) Patent No.: US 10,950,545 B2
(45) Date of Patent: Mar. 16, 2021

(54) CIRCUIT WIRING TECHNIQUES FOR STACKED TRANSISTOR STRUCTURES

(71) Applicant: International Business Machines Corporation, Armonk, NY (US)

(72) Inventors: Dongbing Shao, Wappingers Falls, NY (US); Chen Zhang, Albany, NY (US); Zheng Xu, Wappingers Falls, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/296,502

(22) Filed: Mar. 8, 2019

(65) Prior Publication Data

US 2020/0286831 A1    Sep. 10, 2020

(51) Int. Cl.
| | | |
|---|---|---|
| *H01L 23/52* | (2006.01) | |
| *H01L 23/50* | (2006.01) | |
| *H01L 27/092* | (2006.01) | |
| *H01L 27/115* | (2017.01) | |
| *H01L 23/528* | (2006.01) | |
| *H01L 21/822* | (2006.01) | |
| *H01L 21/8238* | (2006.01) | |
| H01L 27/11551 | (2017.01) | |
| H01L 27/11597 | (2017.01) | |

(52) U.S. Cl.
CPC ...... *H01L 23/5286* (2013.01); *H01L 21/8221* (2013.01); *H01L 21/823871* (2013.01); *H01L 23/50* (2013.01); *H01L 27/092* (2013.01); H01L 27/11551 (2013.01); H01L 27/11597 (2013.01)

(58) Field of Classification Search
CPC ... H01L 23/5286; H01L 23/50; H01L 27/092; H01L 27/11551; H01L 27/11597
See application file for complete search history.

(56) References Cited

U.S. PATENT DOCUMENTS

| | | | |
|---|---|---|---|
| 6,670,642 B2 * | 12/2003 | Takaura | .............. H01L 27/0688 257/302 |
| 6,768,185 B2 | 7/2004 | Cleeves et al. | |
| 6,841,813 B2 | 1/2005 | Walker et al. | |
| 7,312,487 B2 | 12/2007 | Alam et al. | |

(Continued)

FOREIGN PATENT DOCUMENTS

WO    2017111866 A1    6/2017

*Primary Examiner* — Ida M Soward
(74) *Attorney, Agent, or Firm* — Randall Bluestone; Ryan, Mason & Lewis, LLP

(57) ABSTRACT

A semiconductor structure includes a three-dimensional stacked transistor structure including first and second field-effect transistors of a first type at a first vertical level and third and fourth field-effect transistors of a second type at a second vertical level disposed over the first vertical level. The semiconductor structure also includes a first gate structure shared between the first and second field-effect transistors at the first vertical level, a second gate structure shared between the third and fourth field-effect transistors at the second vertical level, and a gate contact shared by the first and second gate structures. The wherein the first and second gate structures are vertically aligned with another in a layout of the three-dimensional stacked transistor structure between source drain/regions of the first, second, third and fourth field-effect transistors.

20 Claims, 8 Drawing Sheets

(56) References Cited

U.S. PATENT DOCUMENTS

| | | | |
|---|---|---|---|
| 7,683,404 B2 * | 3/2010 | Jang | H01L 21/8221 |
| | | | 257/202 |
| 7,683,428 B2 | 3/2010 | Chidambarrao et al. | |
| 7,982,221 B2 * | 7/2011 | Han | H01L 27/1108 |
| | | | 257/67 |
| 8,324,045 B2 * | 12/2012 | Park | |
| 8,921,976 B2 * | 12/2014 | Zhang | H01L 24/94 |
| | | | 257/531 |
| 9,177,890 B2 | 11/2015 | Du | |
| 9,299,848 B2 * | 3/2016 | Kato | H01L 29/78648 |
| 9,431,435 B2 * | 8/2016 | Ando | H01L 29/78603 |
| 9,525,073 B2 * | 12/2016 | Atsumi | H01L 29/785 |
| 9,564,432 B2 * | 2/2017 | Or-Bach | H01L 27/0694 |
| 9,659,963 B2 | 5/2017 | Cheng et al. | |
| 9,672,873 B2 * | 6/2017 | Yamamoto | G11C 8/08 |
| 9,685,500 B2 * | 6/2017 | Yamazaki | H01L 29/78696 |
| 9,691,695 B2 | 6/2017 | Guo et al. | |
| 9,716,100 B2 * | 7/2017 | Atsumi | G11C 7/16 |
| 10,008,511 B2 | 6/2018 | Lee | |
| 10,014,292 B2 * | 7/2018 | Or-Bach | H01L 25/071 |
| 10,020,336 B2 * | 7/2018 | Ikeda | H01L 27/14601 |
| 10,192,913 B2 * | 1/2019 | Kurokawa | H01L 29/24 |
| 10,217,752 B2 * | 2/2019 | Atsumi | H01L 29/7869 |
| 10,593,683 B2 * | 3/2020 | Atsumi | G11C 11/24 |
| 10,665,587 B2 * | 5/2020 | Ikeda | H01L 23/535 |
| 2009/0004826 A1 * | 1/2009 | Kim | H01L 27/11568 |
| | | | 438/459 |
| 2009/0026524 A1 * | 1/2009 | Kreupl | H01L 25/0657 |
| | | | 257/316 |
| 2010/0012980 A1 * | 1/2010 | Song | H01L 23/481 |
| | | | 257/208 |
| 2015/0076578 A1 * | 3/2015 | Sakamoto | H01L 27/11548 |
| | | | 257/300 |
| 2015/0243643 A1 * | 8/2015 | Li | H01L 23/5226 |
| | | | 438/109 |
| 2015/0348961 A1 * | 12/2015 | Isobe | H01L 23/60 |
| | | | 361/56 |
| 2016/0043074 A1 | 2/2016 | Hurley et al. | |
| 2017/0025412 A1 | 1/2017 | Jun et al. | |

* cited by examiner

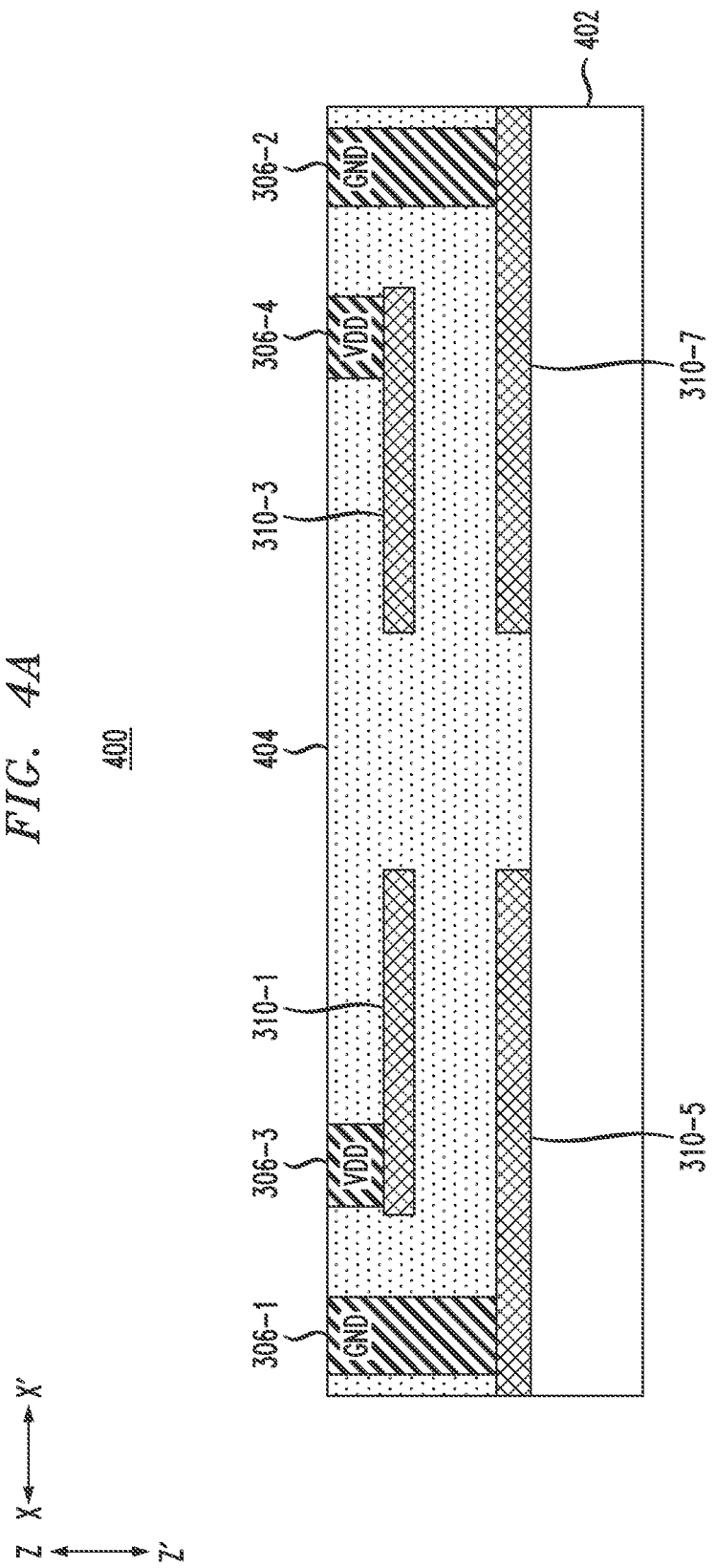

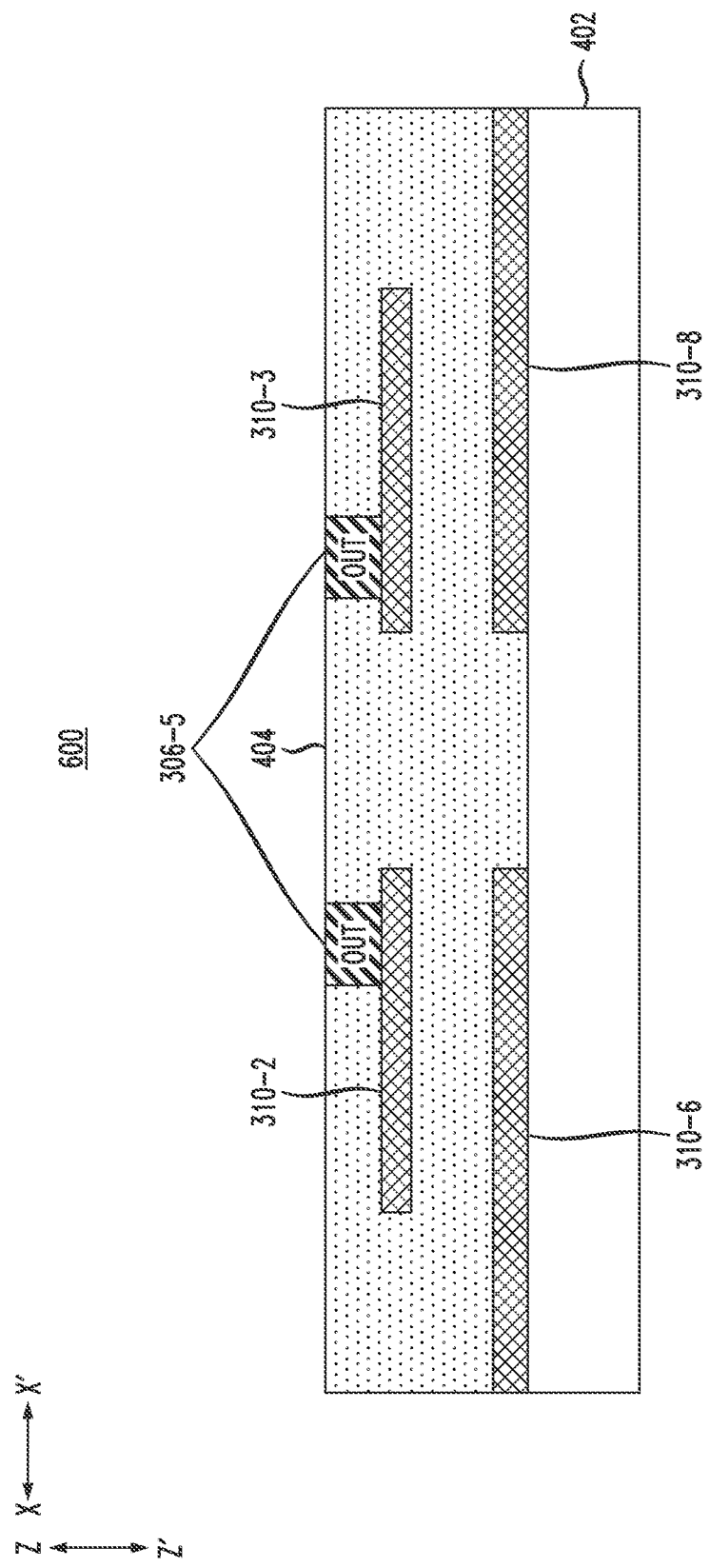

CIRCUIT WIRING TECHNIQUES FOR STACKED TRANSISTOR STRUCTURES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide improved circuit wiring techniques for stacked transistor structures.

In one embodiment, a semiconductor structure comprises a three-dimensional stacked transistor structure comprising first and second field-effect transistors of a first type at a first vertical level and third and fourth field-effect transistors of a second type at a second vertical level disposed over the first vertical level. The semiconductor structure also comprises a first gate structure shared between the first and second field-effect transistors at the first vertical level, a second gate structure shared between the third and fourth field-effect transistors at the second vertical level, and a gate contact shared by the first and second gate structures. The first and second gate structures are vertically aligned with another in a layout of the three-dimensional stacked transistor structure between source drain/regions of the first, second, third and fourth field-effect transistors.

In another embodiment, an integrated circuit comprises a three-dimensional stacked transistor structure. The three-dimensional stacked transistor structure comprises first and second field-effect transistors of a first type at a first vertical level, third and fourth field-effect transistors of a second type at a second vertical level disposed over the first vertical level, a first gate structure shared between the first and second field-effect transistors at the first vertical level, a second gate structure shared between the third and fourth field-effect transistors at the second vertical level, and a gate contact shared by the first and second gate structures. The first and second gate structures are vertically aligned with another in a layout of the three-dimensional stacked transistor structure between source drain/regions of the first, second, third and fourth field-effect transistors.

In another embodiment, a method of forming a semiconductor structure comprises forming first and second field-effect transistors of a first type at a first vertical level of the semiconductor structure, forming third and fourth field-effect transistors of a second type at a second vertical level of the semiconductor structure over the first vertical level of the semiconductor structure, forming a first gate structure shared between the first and second field-effect transistors at the first vertical level, forming a second gate structure shared between the third and fourth field-effect transistors at the second vertical level, and forming a gate contact shared by the first and second gate structures. The first, second, third and fourth field-effect transistors provide a three-dimensional stacked transistor structure. The first and second gate structures are vertically aligned with another in a layout of the three-dimensional stacked transistor structure between source drain/regions of the first, second, third and fourth field-effect transistors.

BRIEF DESCRIPTION OF THE DRAWINGS

FIG. 4A depicts a cross-sectional view taken along line A-A of FIG. 3 with a first power rail configuration, according to an embodiment of the invention.

FIG. 6A depicts a cross-sectional view taken along line C-C of FIG. 3 with the first power rail configuration, according to an embodiment of the invention.

DETAILED DESCRIPTION

Figure 1:
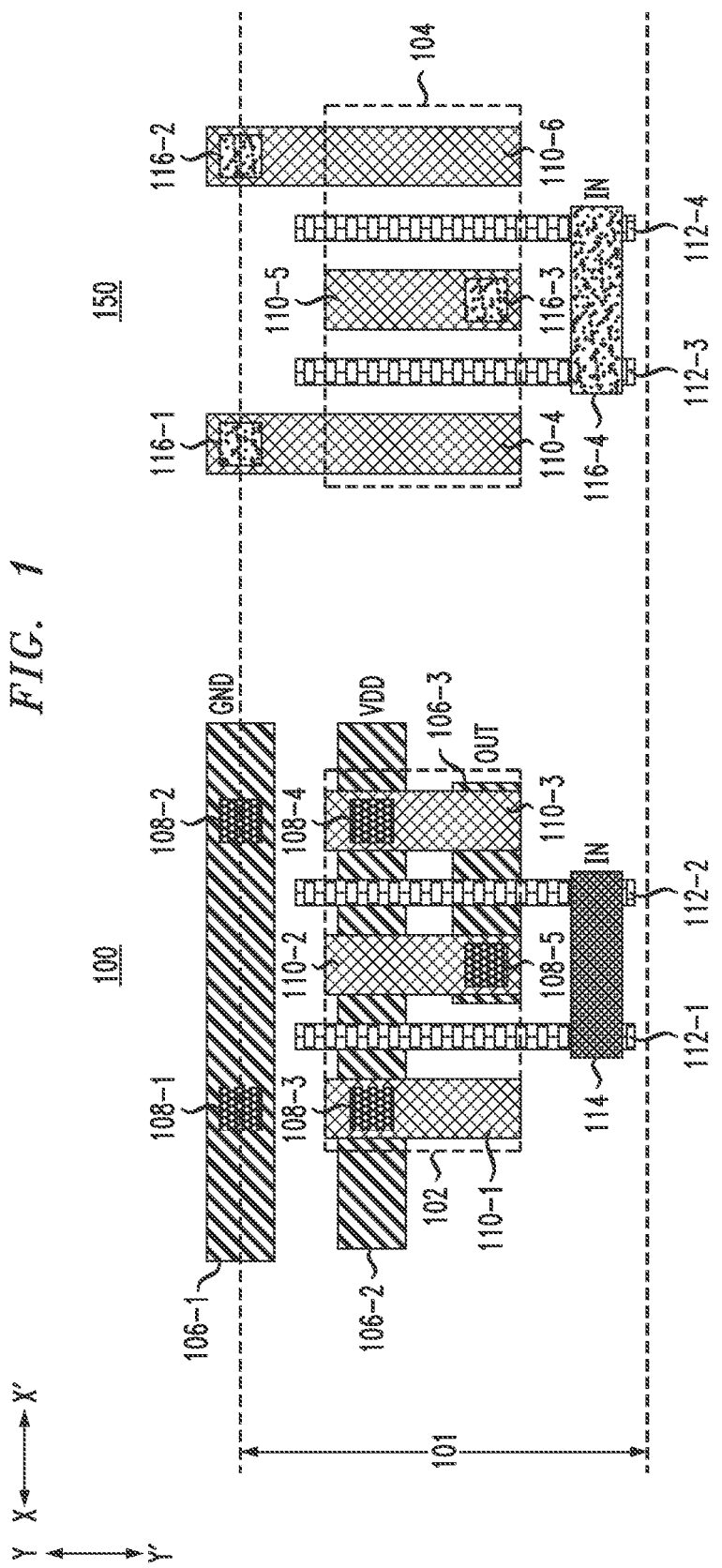
FIG. 1 depicts top-down views of an inverter structure, according to an embodiment of the invention.

Illustrative embodiments of the invention may be described herein in the context of illustrative methods for improving circuit wireability in three-dimensional stacked transistor structures along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

In traditional CMOS structures, the nFET and pFET are on a same horizontal level. To provide increased CMOS scaling, some structures may utilize three-dimensional (3D) monolithic stacking of nFET and pFET transistors (e.g., with the nFET on a first level and the pFET on a second level vertically aligned with the nFET, with the pFET on the first level and the nFET on the second level vertically aligned with the pFET, etc.). 3D monolithic stacking of a unit cell (e.g., a CMOS structure, an inverter, a NAND or other logic gate or gates, etc.) decreases the cell height (e.g., direction Y-Y' in the figures described below). 3D monolithic structures are "taller" (e.g., in direction Z-Z' in the figures described below). 3D monolithic structures are an attractive option in that continued scaling does not demand aggressive lithography advancements for front-end-of-line (FEOL) and back-end-of-line (BEOL) patterning.

From a circuit layout design point of view, the immediate consequence of vertical stacking is the reduction of cell height measured in the number of tracks (e.g., it is cut to approximately half). Wiring such a low track-height design is very challenging, as the number of access points for each terminal (e.g., inputs and outputs) is very limited. This presents a challenge for 7 nm designs and will become more difficult in stacked designs.

Illustrative embodiments provide solutions to the above-described wireability problem in 3D monolithically stacked CMOS and other structures. Some embodiments do so by increasing the cell track height through a rearrangement of transistor positioning in layout designs. While various embodiments are described below in the context of inverter layout designs, it should be appreciated that the solutions described herein may also be used for other types of structures, including other types of CMOS structures, logic gates, etc.

In some embodiments a track count (e.g., a number of metal tracks needed for routing in a unit cell) of 5T or 6T may be achieved, which is practically useful for various structures such as inverter designs. 3T layouts, in some cases, may not be useful for complex circuits like flip-flops which require significant inter-cell wiring. Non-3D integration (3Di) stacking has top-bottom alignment issues, so may not be able to achieve such structures.

As noted above, some embodiments increase the cell height while improving circuit density. Consider, for example, a 6T inverter layout with a 30 nm BEOL metal pitch, where the cell height may be 180 nm with a cell width of 3 contacted poly pitch (CPP) in a single diffusion break (SDB) case. In a stacked case, the cell height reduces to approximately 100 nm and thus achieves approximately 0.56× scaling. In various embodiments described below, the cell height may still be 180 nm, but the cell width reduces to 2CPP and thus provides 0.67× scaling. Thus, illustrative embodiments provide scaling advantages with improved wireability, which helps scaling from a circuit perspective.

Figure 3:
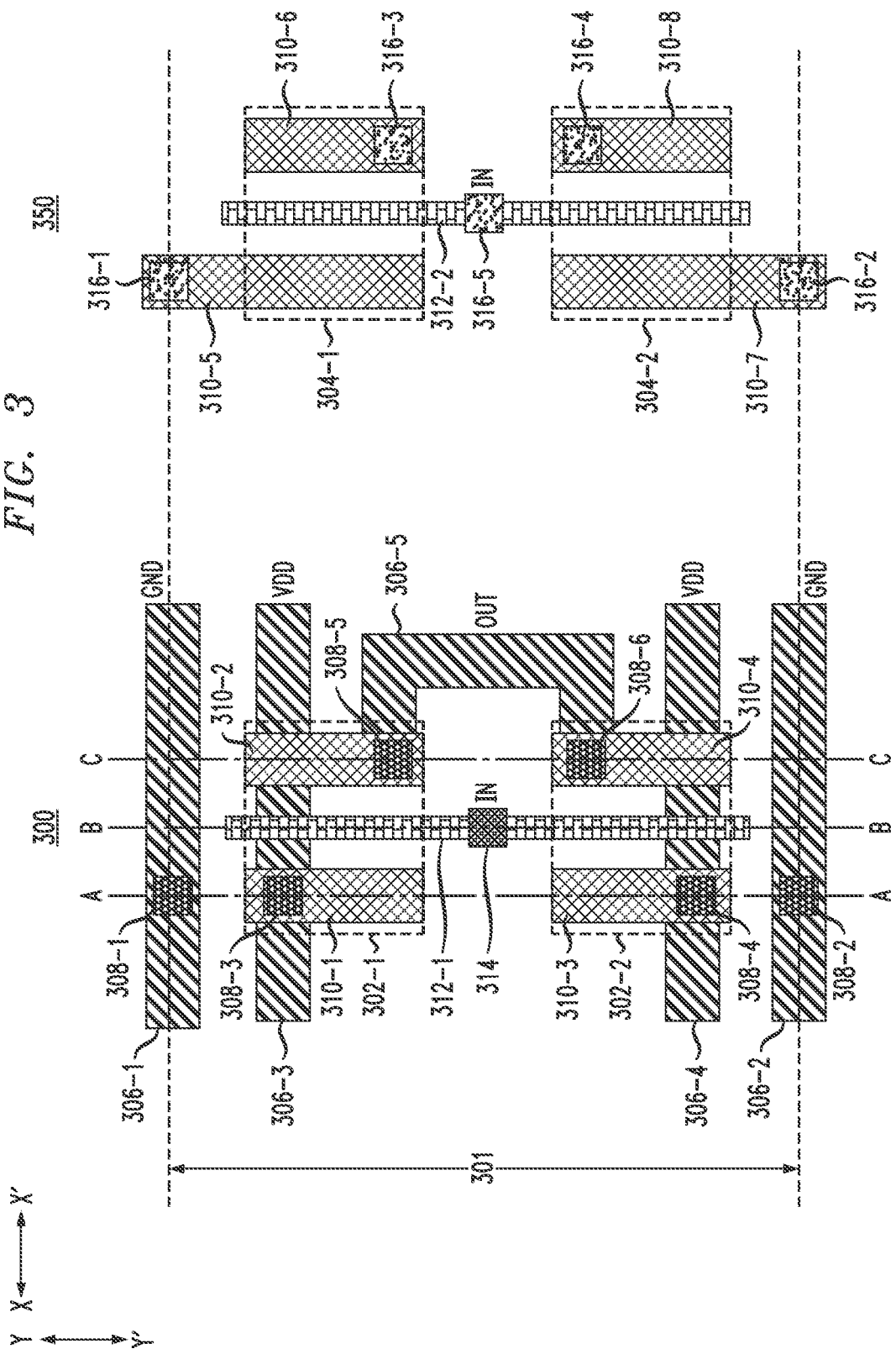
FIG. 3 depicts top-down views of another inverter structure, according to an embodiment of the invention.

In some embodiments, a high track-height 3D stacked logic cell design is utilized where in a top tier, two FETs of the same polarity (e.g., two nFETs or two pFETs) share a single gate structure and a same gate contact. The gate contact may be located in a center of the layout. This gate structure and gate contact is also shared with two FETs of the other polarity in the bottom tier of the cell located right beneath the two FETs of the top tier. It should be appreciated that the gate contact need not necessarily be located in the exact center of the layout, but may instead be located in a central region in a space (in direction Y-Y' in FIG. 3 described below) the source/drain regions of the two nFETS and two pFETs of the 3D stacked logical cell design as shown in FIG. 3 described in further detail below. In some embodiments, a 3D stacked logic cell includes two power rails and two ground rails. In some cases, all four rails (e.g., the two power rails and the two ground rails) are on the top of the stacked transistors. In other cases, either the two power rails or the two ground rails are beneath the stacked transistors.

FIG. 1 illustrates top-down views 100 and 150 of first and second stacked levels, respectively, of a monolithically stacked inverter layout design of two nFETs and two pFETs connected in parallel with one another. The top-down view 100 illustrates a pFET active region 102, and the top-down view 150 illustrates an nFET active region 104. The inverter layout design of FIG. 1 has a cell height 101. It is assumed that the pFET active region 102 is on top of the nFET active region 104, with elements of the top-down view 100 vertically aligned with corresponding elements of the top-down view 150 as described in further detail below.

The inverter layout design of FIG. 1 includes metal connections 106-1, 106-2 and 106-3 (collectively, metal connections 106). The metal connection 106-1 provides a common source connection (e.g., to a low or ground (GND) voltage) for the two nFETs of nFET active region 104 that are connected in parallel (e.g., through vias 108-1 and 108-2 and through-vias 116-1 and 116-2 described in further detail below). The metal connection 106-2 provides a common source connection (e.g., to a high or VDD voltage) for the two pFETs of the pFET active region 102 that are connected in parallel (e.g., through vias 108-3 and 108-4 described in further detail below). The metal connection 106-3 provides an output (OUT) connection for the FIG. 1 inverter layout design, which is a shared drain connection for the two pFETs of the pFET active region 102 and the two nFETS of the nFET active region 104 (e.g., through via 108-5 and through-via 116-3 described in further detail below). It should be noted that the labeling of "source" and "drain" connections above is for the case where the pFETs are in the upper vertical level of the stack and the nFETs are in the lower vertical level of the stack. If the nFETs are instead in the upper vertical level and the pFETs are in the lower vertical level of the stack, the "source" and "drain" labeling would be suitably reversed.

It should be noted that in the FIG. 1 design, the ground voltage (GND) and VDD are adjacent (e.g., metal connections 106-1 and 106-2 are adjacent to one another).

Vias 108-1, 108-2, 108-3, 108-4 and 108-5 (collectively, vias 108) are formed as illustrated, along with through-layer vias 116-1, 116-2, 116-3 and 116-4 (collectively, through-layer vias 116) that bring contacts from the bottom nFET level in top-down view 150 to the top pFET level in top-down view 100. The vias 108-1 and 108-2 are vertically aligned with the through-layer vias 116-1 and 116-2, respectively. The via 108-5 is vertically aligned with the through-layer via 116-3. The through-layer via 116-4 is vertically aligned with gate contact 114.

Source/drain regions or contacts 110-1, 110-2, 110-3, 110-4, 110-5 and 110-6 (collectively, source/drain regions or contacts 110) are formed as illustrated. Source/drain contact 110-1 is vertically aligned with source/drain contact 110-4, source/drain contact 110-2 is vertically aligned with source/drain contact 110-5, and source/drain contact 110-3 is vertically aligned with source/drain contact 110-6.

Gates 112-1, 112-2, 112-3 and 112-4 (collectively, gates 112) are formed as illustrated. The gate 112-1 is vertically aligned with gate 112-3, and the gate 112-2 is vertically aligned with the gate 112-4. The gates 112 are connected to the input (IN) of the FIG. 1 inverter (e.g., through gate contact 114 and through-via 116-4). As noted above, the metal connection 106-3 provides an output (OUT) of the FIG. 1 inverter.

Figure 2:
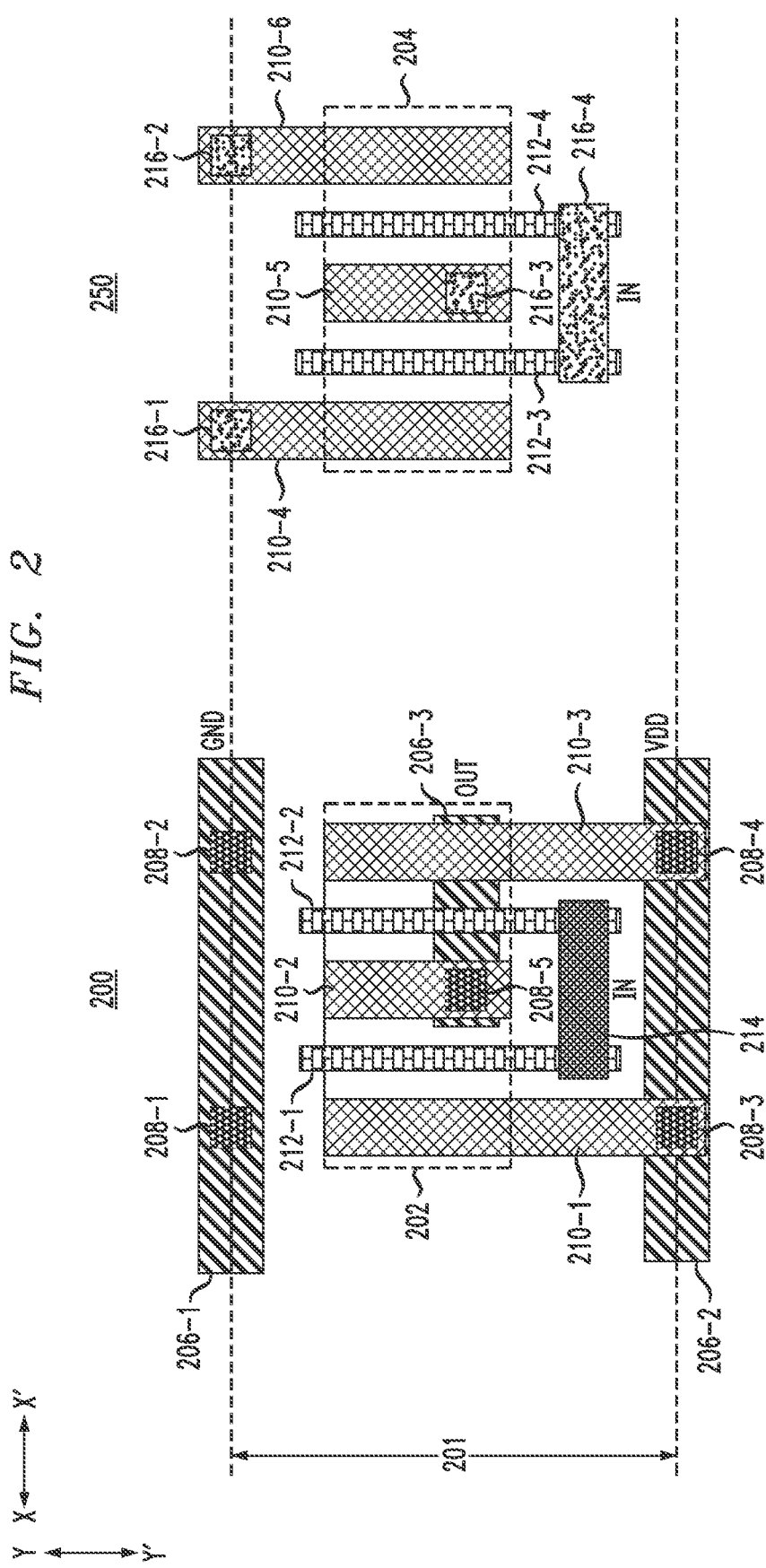
FIG. 2 depicts top-down views of another inverter structure, according to an embodiment of the invention.

FIG. 2 illustrates top-down views 200 and 250 of first and second stacked levels, respectively, of a monolithically stacked inverter layout design of two nFETs and two pFETs connected in parallel with one another. The top-down view 200 illustrates a pFET active region 202, and the top-down view 250 illustrates an nFET active region 204. The inverter layout design of FIG. 2 has a cell height 201. It is assumed that the pFET active region 202 is on top of the nFET active region 204, with elements of the top-down view 200 vertically aligned with corresponding elements of the top-down view 250 as described in further detail below.

The inverter layout design of FIG. 2 includes metal connections 206-1, 206-2 and 206-3 (collectively, metal connections 206). The metal connection 206-1 provides a common source connection (e.g., to a low or GND voltage) for the two nFETs of nFET active region 204 that are connected in parallel (e.g., through vias 208-1 and 208-2 and through-vias 216-1 and 216-2 described in detail below). The metal connection 206-2 provides a common source connection (e.g., to a high or VDD voltage) for the two pFETs of the pFET active region 202 that are connected in parallel (e.g., through vias 208-3 and 208-4 described in further detail below). The metal connection 206-3 provides an output (OUT) connection for the FIG. 2 inverter layout design, which is a shared drain connection for the two pFETs of the pFET active region 202 and the two nFETS of the nFET active region 204 (e.g., through via 208-5 and through-via 216-3 described in further detail below).

It should be noted that in the FIG. 2 design, the low (GND) voltage and high (VDD) voltage power rails are at the boundaries as opposed to being adjacent to one another as in the FIG. 1 design. The FIG. 2 inverter design, however, has a risk of shorting between the gate contact and the source/drain contacts (e.g., contacts 214 and 210 described in further detail below).

Vias 208-1, 208-2, 208-3, 208-4 and 208-5 (collectively, vias 208) are formed as illustrated, along with through-layer vias 216-1, 216-2, 216-3 and 216-4 (collectively, through-layer vias 216) that bring contacts from the bottom nFET level in top-down view 250 to the top pFET level in top-down view 200. The vias 208-1 and 208-2 are vertically aligned with the through-layer vias 216-1 and 216-2, respectively. The via 208-5 is vertically aligned with the through-layer via 216-3. The through-layer via 216-4 is vertically aligned with gate contact 214.

Source/drain regions or contacts 210-1, 210-2, 210-3, 210-4, 210-5 and 210-6 (collectively, source/drain regions or contacts 210) are formed as illustrated. Source/drain contact 210-1 is vertically aligned with source/drain contact 210-4, source/drain contact 210-2 is vertically aligned with source/drain contact 210-5, and source/drain contact 210-3 is vertically aligned with source/drain contact 210-6.

Gates 212-1, 212-2, 212-3 and 212-4 (collectively, gates) are formed as illustrated. The gate 212-1 is vertically aligned with gate 212-3, and the gate 212-2 is vertically aligned with the gate 212-4. The gates 212 are connected to the input (IN) of the FIG. 2 inverter (e.g., via gate contact 214 and through-layer via 216-4). As noted above, the metal connection 206-3 provides an output (OUT) of the FIG. 2 inverter.

FIG. 3 illustrates top-down views 300 and 350 of first and second stacked levels, respectively, of a monolithically stacked inverter layout design of two nFETs and two pFETs connected in parallel with one another. The inverter layout design of FIG. 3 improves wireability, increasing the cell height 301 but reducing the cell width (e.g., in direction X-X'). In this manner, the total effective channel width Weff is kept the same but the number of access points increases. In the FIG. 3 layout, two pFET regions 302-1 and 302-2 (collectively, pFET regions 302) are side-by-side (shown in top-down view 300) along the Y-Y' direction rather than along the X-X' direction as in the inverter layout designs of FIGS. 1 and 2. Similarly, two nFET regions 304-1 and 304-2 (collectively, nFET regions 304) are side-by-side (shown in top-down view 350) along the Y-Y' direction rather than along the X-X' direction as in the inverter layout designs of FIGS. 1 and 2. As noted above, though the cell height 301 for the FIG. 3 layout is larger than the cell heights 101 and 201 for the FIG. 1 and FIG. 2 layouts, the cell width in the FIG. 3 layout is lower, resulting in a similar area footprint but with improved access points for contacts.

The top-down view 300 illustrates pFET active regions 302, and the top-down view 350 illustrates nFET active regions 304. The inverter layout design of FIG. 3 has a cell height 301. It is assumed that the pFET active regions 302 are on top of the nFET active regions 304, with elements of the top-down view 300 vertically aligned with corresponding elements of the top-down view 350 as described in further detail below.

The inverter layout design of FIG. 3 includes metal connections 306-1, 306-2 and 306-3, 306-4 and 306-5 (collectively, metal connections 306). The metal connection 306-1 provides a source connection (e.g., to a low or GND voltage) for the nFET active region 304-1 (e.g., through via 308-1 and through-via 316-1 described in further detail below), and the metal connection 306-2 provides a source connection for the nFET active region 304-2 (e.g., through via 308-2 and through-via 316-2 described in further detail below). The metal connection 306-3 provides a source connection for the pFET active region 302-1 (e.g., through via 308-3 described in further detail below), and the metal connection 306-4 provides a source connection for the pFET active region 302-2 (e.g., through via 308-4 described in further detail below). The metal connection 306-5 provides an output (OUT) connection for the FIG. 3 inverter layout design, which is a shared drain connection for the two pFETs of the pFET active regions 302 and the two nFETS of the nFET active regions 304 (e.g., through vias 308-5 and 308-6 and through-vias 316-3 and 316-4 described in further detail below).

Vias 308-1, 308-2, 308-3, 308-4, 308-5 and 308-6 (collectively, vias 308) are formed as illustrated, along with through-layer vias 316-1, 316-2, 316-3, 316-4 and 316-5 (collectively, through-layer vias 316) that bring contacts from the bottom nFET level in top-down view 350 to the top pFET level in top-down view 300. Via 308-1 is vertically aligned with through-layer via 316-1, via 308-2 is vertically aligned with through-layer via 316-2, via 308-5 is vertically aligned with through-layer via 316-3, and via 308-6 is vertically aligned with through-layer via 316-4. The through-layer via 316-5 is vertically aligned with gate contact 314.

Source/drain contacts or regions 310-1, 310-2, 310-3, 310-4, 310-5, 310-6, 310-7 and 310-8 (collectively, source/drain contacts or regions 310) are formed as illustrated. Source/drain contact 310-1 is vertically aligned with source/drain contact 310-5, source/drain contact 310-2 is vertically aligned with source/drain contact 310-6, source/drain contact 310-3 is vertically aligned with source/drain contact 310-7, and source/drain contact 310-4 is vertically aligned with source/drain contact 310-8.

Gates 312-1 and 312-2 (collectively, gates 312) are formed as illustrated. The gates 312-1 and 312-2 are vertically aligned with one another. The gates 312 are connected to the input (IN) of the FIG. 3 inverter (e.g., through the gate contact 314 and the through-layer via 316-5). As noted above, the metal connection 306-5 provides an output (OUT) of the FIG. 3 inverter.

FIG. 4A shows a cross-sectional view 400 taken along line A-A in FIG. 3 (e.g., cross-sectional view 400 is a "source" cross-sectional view). FIG. 4A shows a substrate 402, source/drain regions 310-1, 310-3, 310-5 and 310-7, and metal connections 306-1, 306-2, 306-3 and 306-4. The pFET source/drain region or contact 310-1 for pFET active region 302-1 is connected to the high or VDD voltage via metal connection 306-3 (through via 308-3, not shown in FIG. 4A). The pFET source/drain region or contact 310-3 for pFET active region 302-2 is also connected to a high or VDD voltage via metal connection 306-4 (through via 308-4, not shown in FIG. 4A). The nFET source/drain region or contact 310-5 for nFET active region 304-1 is connected to a low or GND voltage via metal connection 306-1 (through via 308-1 and through-via 316-1, not shown in FIG. 4A), and the nFET source/drain region or contact 310-7 for nFET active region 304-2 is connected to the low or GND voltage via metal connection 306-2 (through via 308-2 and through-via 316-2, not shown in FIG. 4A).

Figure 4B:
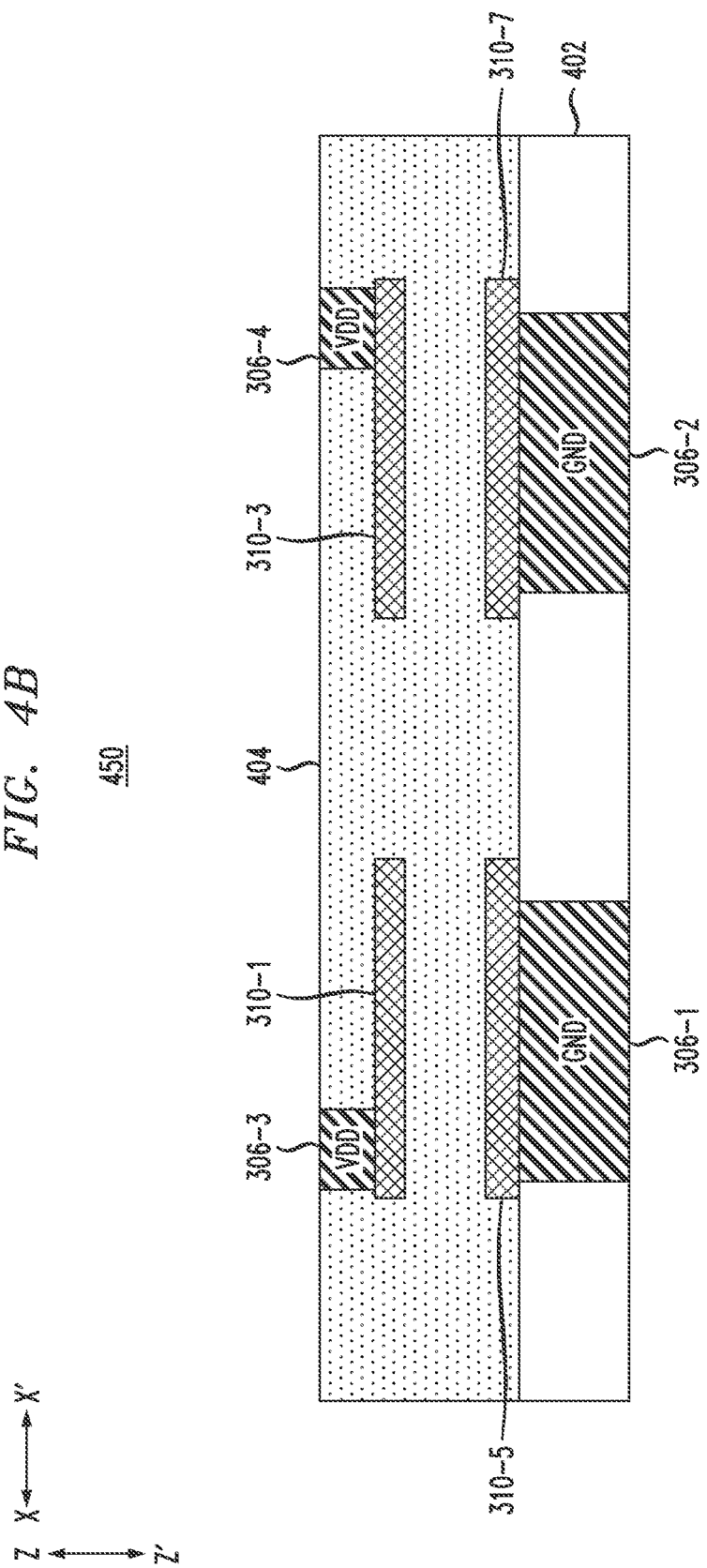
FIG. 4B depicts a cross-sectional view taken along line A-A of FIG. 3 with a second power rail configuration, according to an embodiment of the invention.

In the FIG. 4A configuration, double power rails are used for the VDD and GND connections. In alternate configurations, however, the GND connections can be put on the backside of the wafer so that there is no need for a double power rail. Such a configuration is illustrated in FIG. 4B, which shows a cross-sectional view 450 taken along line A-A in FIG. 3 (e.g., cross-sectional view 450 is a "source" cross-sectional view). In the FIG. 4B configuration, as illustrated, the nFET source/drain regions or contacts 310-5 and 310-7 need not extend to the outer edges of the structure (e.g., in direction Y-Y') as the low or GND connection is at the backside of the wafer.

Figure 5:
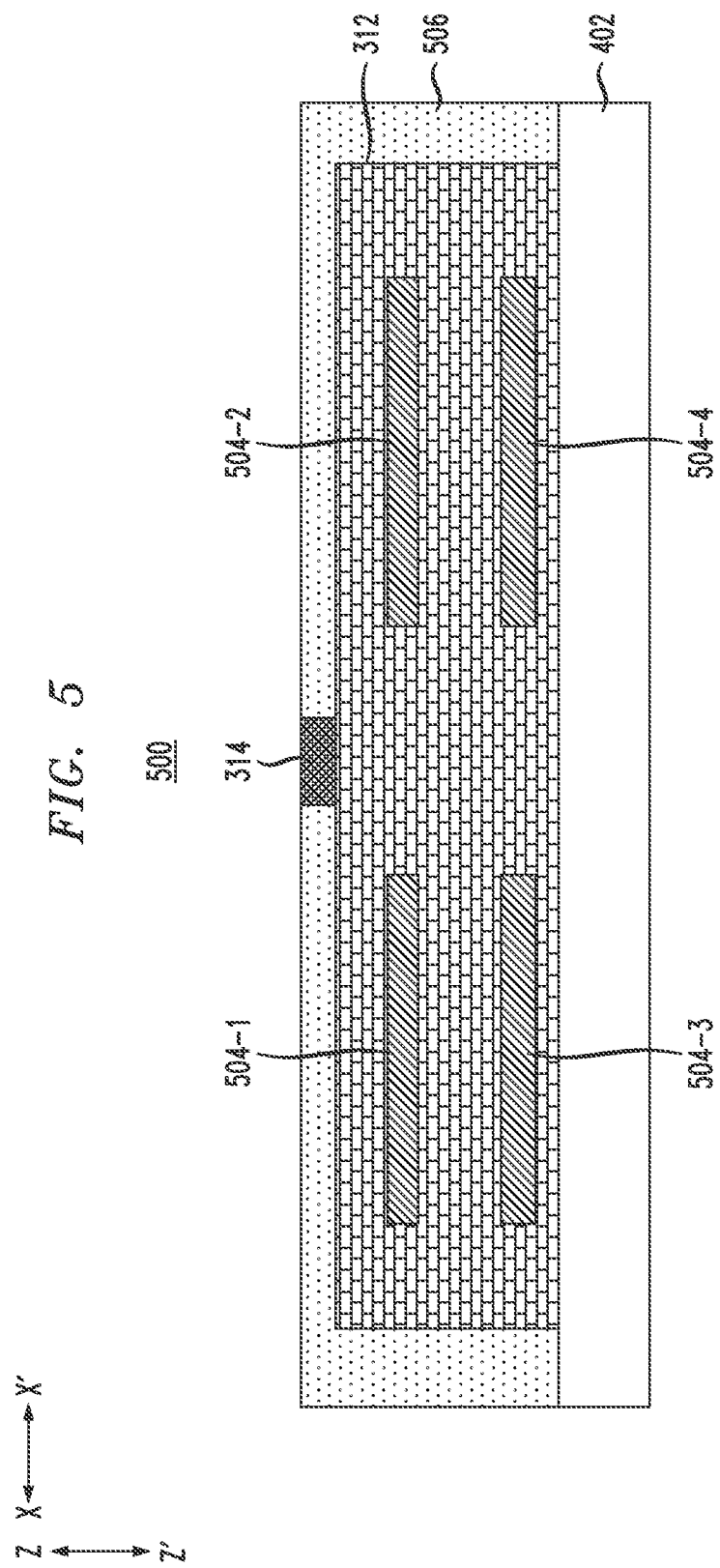
FIG. 5 depicts a cross-sectional view taken along line B-B of FIG. 3, according to an embodiment of the invention.

FIG. 5 shows a cross-sectional view 500 taken along line B-B in FIG. 3 (e.g., cross-sectional view 500 is a "gate" cross-sectional view). As illustrated, the gates 312 are formed over the substrate 402 and surrounding a set of channels 504-1, 504-2, 504-3 and 504-4 (collectively, channels 504). The channels 504-1 and 504-2 are pFET channels for the pFET active regions 302-1 and 302-2, respectively. The channels 504-3 and 504-4 are nFET channels for the nFET active regions 304-1 and 304-2, respectively. The cross-sectional view 500 further shows the gate contact 314, which provides an input (IN) for the FIG. 3 inverter to the gate 312, disposed in an interlayer dielectric (ILD) layer 506.

FIG. 6A shows a cross-sectional view 600 taken along line C-C in FIG. 3 (e.g., cross-sectional view 600 is a "drain" cross-sectional view). FIG. 6A shows the substrate 402, source/drain regions 310-2, 310-4, 310-6 and 310-8, and metal connection 306-5. The pFET source/drain region or contact 310-2 for pFET active region 302-1, the pFET source/drain region or contact 310-4 for pFET active region 302-4, the nFET source/drain region or contact 310-6 for nFET active region 304-1, and the nFET source/drain region or contact 310-8 for nFET active region 304-2 are all connected to the output (OUT) of the FIG. 3 inverter via the metal connection 306-5. The nFET source/drain regions or contacts 310-6 and 310-8 for the nFET active regions 304 connect using the through-vias 316-3 and 316-4 (not shown in FIG. 6A).

Figure 6B:
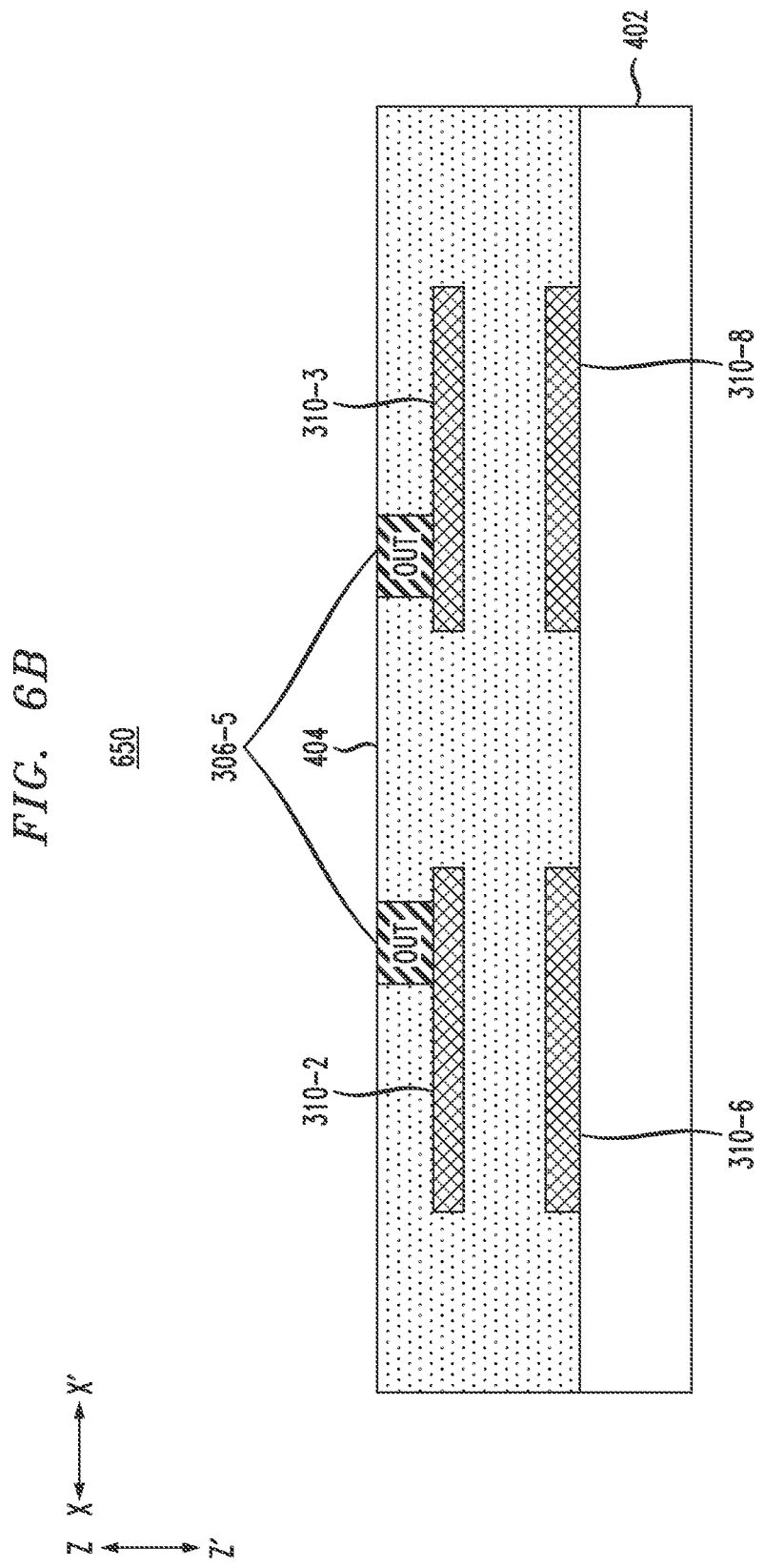
FIG. 6B depicts a cross-sectional view taken along line C-C of FIG. 3 with the second power rail configuration, according to an embodiment of the invention.

FIG. 6A corresponds to the FIG. 4A configuration (e.g., with double power rails for the VDD and GND connections), where the nFET source/drain regions or contacts 310-6 and 310-8 extend to the outer edges of the structure (e.g., in direction Y-Y'). FIG. 6B shows a cross-sectional view 650 taken along the line C-C in FIG. 3 (e.g., cross-sectional view 650 is a "drain" cross-sectional view) that corresponds to the FIG. 4B configuration, where the nFET source/drain regions or contacts 310-6 and 310-8 need not extend to the outer edges of the structure (in direction Y-Y').

In some embodiments, a semiconductor structure comprises a 3D stacked transistor structure comprising first and second FETs of a first type at a first vertical level and third and fourth FETs of a second type at a second vertical level disposed over the first vertical level. The semiconductor structure also comprises a first gate structure shared between the first and second FETs at the first vertical level, a second gate structure shared between the third and fourth FETs at the second vertical level, and a gate contact shared by the first and second gate structures. The first and second gate structures are vertically aligned with another in a layout of the 3D stacked transistor structure between source drain/regions of the first, second, third and fourth FETs.

The first and second FETs may comprise nFETs and the third and fourth FETs may comprise pFETs.

The semiconductor structure may further comprise a first metal contact disposed at a first edge of the layout providing a connection to a first source/drain region of the first FET through a first via in the second vertical level and a first through-layer via in the first vertical level, and a second metal contact disposed at a second edge of the layout opposite the first edge providing a connection to a first source/drain region of the second FET through a second via in the second vertical level and a second through-layer via in the second vertical level. The semiconductor structure may further comprise a third metal contact disposed between the first metal contact and the gate contact providing a connection to a first source/drain region of the third FET through a third via in the second vertical level, and a fourth metal contact disposed between the second metal contact and the gate contact providing a connection to a first source/drain region of the fourth FET through a fourth via in the second vertical level. The semiconductor structure may further comprise a fifth metal contact disposed at a third edge of the layout between the third metal contact and the fourth metal contact spaced apart from the gate contact, the fifth metal contact providing a shared connection to: a second source/drain region of the first FET through a fifth via in the second vertical level and a third through-layer via in the first vertical level; a second source/drain region of the second FET through a sixth via in the second vertical level and a fourth through-layer via in the first vertical level; a second source/drain region of the third FET through the fifth via in the second vertical level; and a second source/drain region of the fourth FET through the sixth via in the second vertical level. The gate contact may provide a connection to the first gate structure though a fifth through-layer via in the first vertical level. The 3D stacked transistor structure may comprise an inverter, the gate contact providing an input for the inverter and the fifth metal contact providing an output for the inverter.

The semiconductor structure may further comprise a first set of power rails for the first and second metal connections and a second set of power rails for the third and fourth metal connections, the first and second set of power rails being disposed over a top of the second vertical level. The first set of power rails is configured for connection to one of a ground voltage and a positive voltage source, and the second set of power rails are configured to the other one of the ground voltage and the positive voltage source.

The semiconductor structure may further comprise a first set of power rails for the first and second metal connections disposed over a top of the second vertical level, and a second set of power rails for the third and fourth metal connections disposed on a backside of a substrate below the first vertical level. The first set of power rails is configured for connection to one of a ground voltage and a positive voltage source, and the second set of power rails are configured to the other one of the ground voltage and the positive voltage source.

In some embodiments, an integrated circuit comprises a 3D stacked transistor structure. The 3D stacked transistor structure comprises first and second FETs of a first type at a first vertical level, third and fourth FETs of a second type at a second vertical level disposed over the first vertical level, a first gate structure shared between the first and second FETs at the first vertical level, a second gate structure shared between the third and fourth FETs at the second vertical level, and a gate contact shared by the first and second gate structures. The first and second gate structures are vertically aligned with another in a layout of the 3D stacked transistor structure between source drain/regions of the first, second, third and fourth FETs.

The integrated circuit may further comprise: a first metal contact disposed at a first edge of the layout providing a connection to a first source/drain region of the first FET through a first via in the second vertical level and a first through-layer via in the first vertical level; a second metal contact disposed at a second edge of the layout opposite the first edge providing a connection to a first source/drain region of the second FET through a second via in the second vertical level and a second through-layer via in the second vertical level; a third metal contact disposed between the first metal contact and the gate contact providing a connection to a first source/drain region of the third FET through a third via in the second vertical level; a fourth metal contact disposed between the second metal contact and the gate contact providing a connection to a first source/drain region of the fourth FET through a fourth via in the second vertical level; and a fifth metal contact disposed at a third edge of the layout between the third metal contact and the fourth metal contact spaced apart from the gate contact, the fifth metal contact providing a shared connection to (i) a second source/drain region of the first FET through a fifth via in the second vertical level and a third through-layer via in the first vertical level, (ii) a second source/drain region of the second FET through a sixth via in the second vertical level and a fourth through-layer via in the first vertical level, (iii) a second source/drain region of the third FET through the fifth via in the second vertical level, and (iv) a second source/drain region of the fourth FET through the sixth via in the second vertical level. The gate contact may provide a connection to the first gate structure though a fifth through-layer via in the first vertical level. The 3D stacked transistor structure may comprise an inverter, the gate contact providing an input for the inverter and the fifth metal contact providing an output for the inverter.

The integrated circuit may further comprise a first set of power rails for the first and second metal connections and a second set of power rails for the third and fourth metal connections, the first and second sets of power rails being disposed over a top of the second vertical level.

The integrated circuit may further comprise a first set of power rails for the first and second metal connections disposed over a top of the second vertical level, and a second set of power rails for the third and fourth metal connections disposed on a backside of a substrate below the first vertical level.

In some embodiments, a method of forming a semiconductor structure comprises forming first and second FETs of a first type at a first vertical level of the semiconductor structure, forming third and fourth FETs of a second type at a second vertical level of the semiconductor structure over the first vertical level of the semiconductor structure, forming a first gate structure shared between the first and second FETs at the first vertical level, forming a second gate structure shared between the third and fourth FETs at the second vertical level, and forming a gate contact shared by the first and second gate structures. The first, second, third and fourth FETs provide a 3D stacked transistor structure. The first and second gate structures are vertically aligned with another in a layout of the 3D stacked transistor structure between source drain/regions of the first, second, third and fourth FETs.

The method may further comprise: forming a first metal contact at a first edge of the layout providing a connection to a first source/drain region of the first FET through a first via in the second vertical level and a first through-layer via in the first vertical level; forming a second metal contact at a second edge of the layout opposite the first edge providing a connection to a first source/drain region of the second FET through a second via in the second vertical level and a second through-layer via in the second vertical level; forming a third metal contact between the first metal contact and the gate contact providing a connection to a first source/ drain region of the third FET through a third via in the second vertical level; forming a fourth metal contact between the second metal contact and the gate contact providing a connection to a first source/drain region of the fourth FET through a fourth via in the second vertical level; and forming a fifth metal contact at a third edge of the layout between the third metal contact and the fourth metal contact spaced apart from the gate contact, the fifth metal contact providing a shared connection to (i) a second source/drain region of the first FET through a fifth via in the second vertical level and a third through-layer via in the first vertical level, (ii) a second source/drain region of the second FET through a sixth via in the second vertical level and a fourth through-layer via in the first vertical level, (iii) a second source/drain region of the third FET through the fifth via in the second vertical level, and (iv) a second source/drain region of the fourth FET through the sixth via in the second vertical level. The gate contact provides a connection to the first gate structure though a fifth through-layer via in the first vertical level. The 3D stacked transistor structure may comprise an inverter, the gate contact providing an input for the inverter and the fifth metal contact providing an output for the inverter.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a three-dimensional stacked transistor structure comprising first and second field-effect transistors of a first type at a first vertical level and third and fourth field-effect transistors of a second type at a second vertical level disposed over the first vertical level;
a first gate structure shared between the first and second field-effect transistors at the first vertical level;
a second gate structure shared between the third and fourth field-effect transistors at the second vertical level; and
a gate contact shared by the first and second gate structures;
wherein the first and second gate structures are vertically aligned with another in a layout of the three-dimensional stacked transistor structure between source drain/regions of the first, second, third and fourth field-effect transistors.

2. The semiconductor structure of claim 1, wherein the first and second field-effect transistors comprise n-type field-effect transistors and the third and fourth field-effect transistors comprise p-type field-effect transistors.

3. The semiconductor structure of claim 1, further comprising:
a first metal contact disposed at a first edge of the layout providing a connection to a first source/drain region of the first field-effect transistor through a first via in the second vertical level and a first through-layer via in the first vertical level;
a second metal contact disposed at a second edge of the layout opposite the first edge providing a connection to a first source/drain region of the second field-effect transistor through a second via in the second vertical level and a second through-layer via in the second vertical level.

4. The semiconductor structure of claim 3, further comprising:
a third metal contact disposed between the first metal contact and the gate contact providing a connection to a first source/drain region of the third field-effect transistor through a third via in the second vertical level;
a fourth metal contact disposed between the second metal contact and the gate contact providing a connection to a first source/drain region of the fourth field-effect transistor through a fourth via in the second vertical level.

5. The semiconductor structure of claim 4, further comprising fifth metal contact disposed at a third edge of the layout between the third metal contact and the fourth metal contact spaced apart from the gate contact, the fifth metal contact providing a shared connection to:
a second source/drain region of the first field-effect transistor through a fifth via in the second vertical level and a third through-layer via in the first vertical level;
a second source/drain region of the second field-effect transistor through a sixth via in the second vertical level and a fourth through-layer via in the first vertical level;
a second source/drain region of the third field-effect transistor through the fifth via in the second vertical level; and
a second source/drain region of the fourth field-effect transistor through the sixth via in the second vertical level.

6. The semiconductor structure of claim 5, wherein the gate contact provides a connection to the first gate structure though a fifth through-layer via in the first vertical level.

7. The semiconductor structure of claim 5, wherein the three-dimensional stacked transistor structure comprises an inverter, the gate contact providing an input for the inverter and the fifth metal contact providing an output for the inverter.

8. The semiconductor structure of claim 4, further comprising a first set of power rails for the first and second metal connections and a second set of power rails for the third and fourth metal connections, the first and second set of power rails being disposed over a top of the second vertical level.

9. The semiconductor structure of claim 8, wherein the first set of power rails is configured for connection to one of a ground voltage and a positive voltage source, the second set of power rails being configured for connection to the other one of the ground voltage and the positive voltage source.

10. The semiconductor structure of claim 4, further comprising:
a first set of power rails for the first and second metal connections disposed over a top of the second vertical level; and
a second set of power rails for the third and fourth metal connections disposed on a backside of a substrate below the first vertical level.

11. The semiconductor structure of claim 10, wherein the first set of power rails is configured for connection to one of a ground voltage and a positive voltage source, the second set of power rails being configured for connection to the other one of the ground voltage and the positive voltage source.

12. An integrated circuit comprising:
a three-dimensional stacked transistor structure comprising:
   first and second field-effect transistors of a first type at a first vertical level;
   third and fourth field-effect transistors of a second type at a second vertical level disposed over the first vertical level;
   a first gate structure shared between the first and second field-effect transistors at the first vertical level;
   a second gate structure shared between the third and fourth field-effect transistors at the second vertical level; and
   a gate contact shared by the first and second gate structures;
wherein the first and second gate structures are vertically aligned with another in a layout of the three-dimensional stacked transistor structure between source drain/regions of the first, second, third and fourth field-effect transistors.

13. The integrated circuit of claim 12, further comprising:
a first metal contact disposed at a first edge of the layout providing a connection to a first source/drain region of the first field-effect transistor through a first via in the second vertical level and a first through-layer via in the first vertical level;
a second metal contact disposed at a second edge of the layout opposite the first edge providing a connection to a first source/drain region of the second field-effect transistor through a second via in the second vertical level and a second through-layer via in the second vertical level;
a third metal contact disposed between the first metal contact and the gate contact providing a connection to a first source/drain region of the third field-effect transistor through a third via in the second vertical level;
a fourth metal contact disposed between the second metal contact and the gate contact providing a connection to a first source/drain region of the fourth field-effect transistor through a fourth via in the second vertical level; and
a fifth metal contact disposed at a third edge of the layout between the third metal contact and the fourth metal contact spaced apart from the gate contact, the fifth metal contact providing a shared connection to (i) a second source/drain region of the first field-effect transistor through a fifth via in the second vertical level and a third through-layer via in the first vertical level, (ii) a second source/drain region of the second field-effect transistor through a sixth via in the second vertical level and a fourth through-layer via in the first vertical level, (iii) a second source/drain region of the third field-effect transistor through the fifth via in the second vertical level, and (iv) a second source/drain region of the fourth field-effect transistor through the sixth via in the second vertical level.

14. The integrated circuit of claim 13, wherein the gate contact provides a connection to the first gate structure though a fifth through-layer via in the first vertical level.

15. The integrated circuit of claim 14, wherein the three-dimensional stacked transistor structure comprises an inverter, the gate contact providing an input for the inverter and the fifth metal contact providing an output for the inverter.

16. The integrated circuit of claim 13, further comprising a first set of power rails for the first and second metal connections and a second set of power rails for the third and fourth metal connections, the first and second sets of power rails being disposed over a top of the second vertical level.

17. The integrated circuit of claim 13, further comprising:
a first set of power rails for the first and second metal connections disposed over a top of the second vertical level; and
a second set of power rails for the third and fourth metal connections disposed on a backside of a substrate below the first vertical level.

18. The integrated circuit of claim 12, wherein the first and second field-effect transistors comprise n-type field-effect transistors and the third and fourth field-effect transistors comprise p-type field-effect transistors.

19. The integrated circuit of claim 16, wherein the first set of power rails is configured for connection to one of a ground voltage and a positive voltage source, the second set of power rails being configured for connection to the other one of the ground voltage and the positive voltage source.

20. The integrated circuit of claim 17, wherein the first set of power rails is configured for connection to one of a ground voltage and a positive voltage source, the second set of power rails being configured for connection to the other one of the ground voltage and the positive voltage source.

* * * * *